US012751136B2

(12) United States Patent
Yi et al.

(10) Patent No.: US 12,751,136 B2
(45) Date of Patent: Sep. 29, 2026

(54) ORGANIC LIGHT-EMITTING DIODE DISPLAY DEVICE

(71) Applicant: UNITED MICROELECTRONICS CORP., Hsin-Chu City (TW)

(72) Inventors: Yen-Tsai Yi, Tainan City (TW); Wei-Chuan Tsai, Changhua County (TW); Jin-Yan Chiou, Tainan City (TW); Hsiang-Wen Ke, Kaohsiung City (TW)

(73) Assignee: UNITED MICROELECTRONICS CORP., Hsin-Chu City (TW)

(*) Notice: Subject to any disclaimer, the term of this patent is extended or adjusted under 35 U.S.C. 154(b) by 434 days.

(21) Appl. No.: 18/381,646

(22) Filed: Oct. 19, 2023

(65) Prior Publication Data

US 2025/0089448 A1 Mar. 13, 2025

(30) Foreign Application Priority Data

Sep. 8, 2023 (TW) ................................ 112134214

(51) Int. Cl.

| | |
|---|---|
| ***H10K 50/81*** | (2023.01) |
| ***H10K 50/11*** | (2023.01) |
| ***H10K 50/82*** | (2023.01) |
| ***H10K 50/856*** | (2023.01) |
| ***H10K 59/131*** | (2023.01) |

(52) U.S. Cl.

CPC ............. *H10K 50/81* (2023.02); *H10K 50/11* (2023.02); *H10K 50/82* (2023.02); *H10K 50/856* (2023.02); *H10K 59/131* (2023.02)

(58) Field of Classification Search

CPC ...... H10K 50/81; H10K 50/11; H10K 50/856; H10K 50/82; H10K 59/131

See application file for complete search history.

(56) References Cited

U.S. PATENT DOCUMENTS

| | | | | |
|---|---|---|---|---|
| 6,861,800 B2 | 3/2005 | Tyan | | |
| 9,401,390 B2 | 7/2016 | Song | | |
| 10,727,446 B2 | 7/2020 | Li | | |
| 10,826,021 B2 * | 11/2020 | Uchida | .............. | H10D 30/6755 |
| 2016/0035807 A1 * | 2/2016 | Shi | ..................... | H10D 30/6746 257/40 |
| 2020/0020753 A1 * | 1/2020 | Zhang | ................ | G06V 40/1318 |

* cited by examiner

*Primary Examiner* — Anne M Hines
(74) *Attorney, Agent, or Firm* — Winston Hsu

(57) ABSTRACT

An organic light-emitting diode display device includes a first light-emitting layer, a first anode, a first reflective pattern, and a dielectric material. The first light-emitting layer, the first anode, and the first reflective pattern are located in a first sub-pixel region. The first anode is disposed under the first light-emitting layer in a vertical direction, and the first reflective pattern is disposed under the first anode in the vertical direction. The dielectric material is partly disposed between the first anode and the first reflective pattern, and the first reflective pattern is electrically connected with the first anode.

19 Claims, 5 Drawing Sheets

ORGANIC LIGHT-EMITTING DIODE DISPLAY DEVICE

BACKGROUND OF THE INVENTION

1. Field of the Invention

The present invention relates to an organic light-emitting diode display device, and more particularly, to an organic light-emitting diode display device including a reflective pattern.

2. Description of the Prior Art

Electroluminescence display devices have gradually replaced liquid crystal display devices and become the mainstream of display technology because of their characteristics such as no need for color filters, self-illumination (no need for backlight modules), and suitability for flexible display devices. Among various electroluminescent display devices, organic light-emitting diode (OLED) display devices are currently a fairly mature technology and have been used in many display products of different sizes and/or different functions, such as mobile phones, tablets, TVs, outdoor electronic boards, digital cameras, head-mounted display devices, VR/AR glasses, and other electronic products. Displays in electronic products such as electronic viewing finders of digital cameras, head-mounted display devices, and VR/AR glasses are generally called micro displays. Compared with other types of micro displays, organic light-emitting diode micro displays have higher resolution, lower display latency, and higher contrast. In addition, the technology of manufacturing OLED micro displays using CMOS processes is generally called OLED on silicon (OLEDoS) technology, and the advantage of this technology is that it can be integrated with display driving circuits and other functional components and/or circuits to achieve the effect of reducing product size.

SUMMARY OF THE INVENTION

An organic light-emitting diode display device is provided in the present invention. A reflective pattern is disposed under and electrically connected with an anode located in a sub-pixel region for improving the viewing angle range and/or the display light uniformity.

According to an embodiment of the present invention, an organic light-emitting diode display device is provided. The organic light-emitting diode display device includes a first light-emitting layer, a first anode, a first reflective pattern, and a dielectric material. The first light-emitting layer, the first anode, and the first reflective pattern are located in a first sub-pixel region. The first anode is disposed under the first light-emitting layer in a vertical direction, and the first reflective pattern is disposed under the first anode in the vertical direction. The dielectric material is partly disposed between the first anode and the first reflective pattern, and the first reflective pattern is electrically connected with the first anode.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
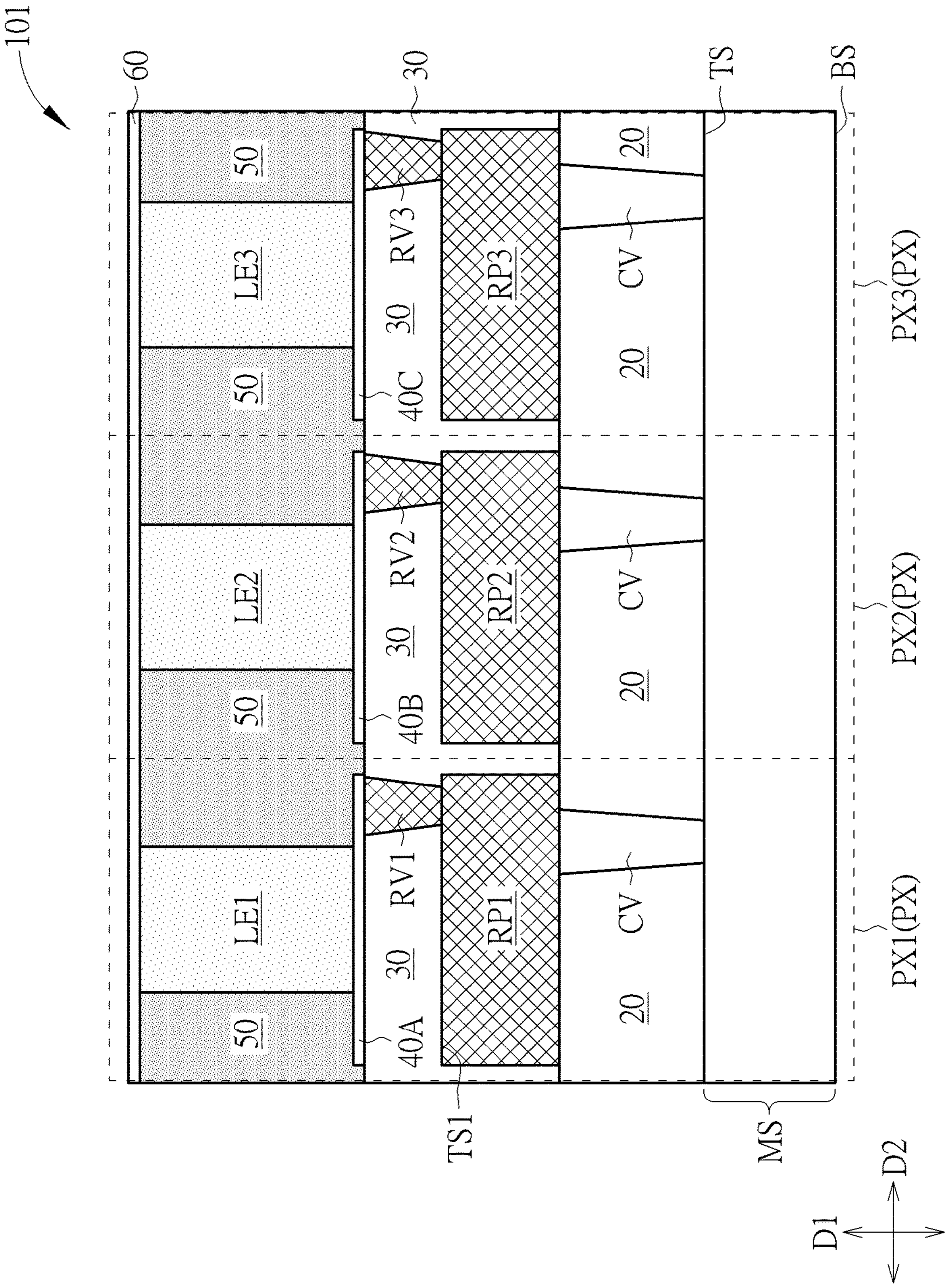
FIG. 1 is a schematic drawing illustrating an organic light-emitting diode display device according to a first embodiment of the present invention.

Please refer to FIG. 1. FIG. 1 is a schematic drawing illustrating an organic light-emitting diode display device 101 according to a first embodiment of the present invention. As shown in FIG. 1, the organic light-emitting diode display device 101 includes a first light-emitting layer LE1, a first anode 40A, a first reflective pattern RP1, and a dielectric material 30. The first light-emitting layer LE1, the first anode 40A, and the first reflective pattern RP1 are located in a first sub-pixel region PX1. The first anode 40A is disposed under the first light-emitting layer LE1 in a vertical direction D1, and the first reflective pattern RP1 is disposed under the first anode 40A in the vertical direction D1. The dielectric material 30 is partly disposed between the first anode 40A and the first reflective pattern RP1, and the first reflective pattern RP1 is electrically connected with the first anode 40A. Because of the first reflective pattern RP1 disposed under and electrically connected with the first anode, the space between the first anode 40A and the first reflective pattern RP1 separated from each other may be used to improve the viewing angle range and/or the display light uniformity of the organic light-emitting diode display device 101, and the display performance of the organic light-emitting diode display device 101 may be enhanced accordingly.

Specifically, in some embodiments, the organic light-emitting diode display device 101 may further include a device substrate MS. The first reflective pattern RP1, the first anode 40A, the first light-emitting layer LE1, and the dielectric material 30 are disposed on the device substrate MS, the first reflective pattern RP1 may be located between the first anode 40A and the device substrate MS in the vertical direction D1, and the first reflective pattern RP1 is electrically connected with the device substrate MS. In some embodiments, the device substrate MS may include a semiconductor substrate and active components, passive components, and/or related circuits disposed in and/or disposed on the semiconductor substrate. In addition, the vertical direction D1 described above may be regarded as a thickness direction of the device substrate MS and/or a thickness direction of the semiconductor substrate in the device substrate. The device substrate MS may have the top surface TS and a bottom surface BS opposite to the top surface TS in the vertical direction D1, and the first reflective pattern RP1, the first anode 40A, the first light-emitting layer LE1, and the dielectric material 30 described above may be disposed at the side of the top surface TS of the device substrate MS. Horizontal directions substantially orthogonal to the vertical direction D1 (such as a horizontal direction D2 and other directions orthogonal to the vertical direction D1) may be substantially parallel with the top surface TS and/or the bottom surface BS of the device substrate MS, but not limited thereto. In this description, a distance between the bottom surface BS of the device substrate MS and a relatively higher location and/or a relatively higher part in the vertical direction D1 may be greater than a distance between the bottom surface BS of the device substrate MS and a relatively lower location and/or a relatively lower part in the vertical direction D1. The bottom or a lower portion of each component may be closer to the bottom surface BS of the device substrate MS in the vertical direction D1 than the top or upper portion of this component. Another component disposed above a specific component may be regarded as being relatively far from the bottom surface BS of the device substrate MS in the vertical direction D1, and another component disposed under a specific component may be regarded as being relatively close to the bottom surface BS of the device substrate MS in the vertical direction D1. It is worth noting that, in this description, a top surface of a specific component may include the topmost surface of this component in the vertical direction D1, and a bottom surface of a specific component may include the bottommost surface of this component in the vertical direction D1, but not limited thereto. Additionally, in this description, the condition that a certain component is disposed between two other components in a specific direction may include a condition that the certain component is sandwiched between the two other components in the specific direction, but not limited thereto.

In some embodiments, the organic light-emitting diode display device 101 may include a plurality of sub-pixel regions PX, some of the sub-pixel regions PX disposed adjacent to one another may be used to emit different colors of light, and required display effect may be achieved by mixing the different colors of light. For example, the first sub-pixel region PX1 may be one of the sub-pixel regions PX, and a second sub-pixel region PX2 and a third sub-pixel region PX3 may be disposed adjacent to the first sub-pixel region PX1. The first sub-pixel region PX1, the second sub-pixel region PX2, and the third sub-pixel region PX3 may be sub-pixel regions of different colors, such as a red sub-pixel region, a green sub-pixel region, and a blue sub-pixel region, but not limited thereto. In addition, a structure of the second sub-pixel region PX2 and a structure of the third sub-pixel region PX3 may be similar to the structure of the first sub-pixel region PX1 described above. For example, the organic light-emitting diode display device 101 may further include a second light-emitting layer LE2, a second anode 40B, and a second reflective pattern RP2 disposed in the second sub-pixel region PX2, and the organic light-emitting diode display device 101 may further include a third light-emitting layer LE3, a third anode 40C, and a third reflective pattern RP3 disposed in the third sub-pixel region PX3. The first light-emitting layer LE1, the second light-emitting layer LE2, and the third light-emitting layer LE3 may be light-emitting layers of different colors. The second anode 40B may be disposed under the second light-emitting layer LE2 in the vertical direction D1, the second reflective pattern RP2 may be disposed under the second anode 40B in the vertical direction D1, another portion of the dielectric material 30 may be disposed between the second anode 40B and the second reflective pattern RP2 in the vertical direction D1, and the second reflective pattern RP2 may be electrically connected with the second anode 40B. The third anode 40C may be disposed under the third light-emitting layer LE3 in the vertical direction D1, the third reflective pattern RP3 may be disposed under the third anode 40C in the vertical direction D1, another portion of the dielectric material 30 may be disposed between the third anode 40C and the third reflective pattern RP3 in the vertical direction D1, and the third reflective pattern RP3 may be electrically connected with the third anode 40C.

In some embodiments, the organic light-emitting diode display device 101 may further include a first reflective via structure RV1 disposed between the first anode 40A and the first reflective pattern RP1, and the first reflective pattern RP1 may be electrically connected with the first anode 40A through the first reflective via structure RV1. The reflective pattern and the reflective via structure are capable of reflecting light for adjusting the light-emitting angle of the sub-pixel region, the light-emitting uniformity of the sub-pixel region, and/or the luminous intensity of the sub-pixel region. However, in some embodiments, the first reflective pattern RP1 and the first anode 40A may be electrically connected with each other by other approaches according to some design considerations. Additionally, the organic light-emitting diode display device 101 may further include a second reflective via structure RV2 and a third reflective via structure RV3. The second reflective via structure RV2 is disposed between the second anode 40B and the second reflective pattern RP2, and the second reflective pattern RP2 may be electrically connected with the second anode 40B through the second reflective via structure RV2. The third reflective via structure RV3 is disposed between the third anode 40C and the third reflective pattern RP3, and the third reflective pattern RP3 may be electrically connected with the third anode 40C through the third reflective via structure RV3. In some embodiments, each of the reflective patterns described above (such as the first reflective pattern RP1) and each of the reflective via structures described above (such as the first reflective via structure RV1) may respectively include an electrically conductive metallic material, such as aluminum (Al), silver (Ag), germanium (Ge), copper (Cu), molybdenum (Mo), titanium (Ti), tin (Sn), an alloy of the above-mentioned materials, a compound of the above-mentioned materials, or other suitable electrically conductive materials, and a material composition of the reflective via structure (such as the first reflective via structure RV1) may be identical to a material composition of the reflective pattern (such as the first reflective pattern RP1), but not limited thereto. In addition, each of the reflective via structures (such as the first reflective via structure RV1) may be directly connected with the corresponding reflective pattern (such as the first reflective pattern RP1) and the corresponding anode (such as the first anode 40A), but not limited thereto.

In some embodiments, the anodes in different sub-pixel regions may be physically and electrically separated from one another because the anodes are used to control the light-emitting conditions of the light-emitting layers, respectively. Therefore, the first anode 40A, the second anode 40B, and the third anode 40C may be physically and electrically separated from one another, and the first reflective pattern RP1, the second reflective pattern RP2, and the third reflective pattern RP3 may be physically and electrically separated from one another, also. Each of the anodes described above (such as the first anode 40A) may include a transparent electrically conductive material, such as transparent conducting oxide (TCO) or other suitable transparent electrically conductive materials. The transparent conducting oxide described above may include indium tin oxide (ITO), indium zinc oxide (IZO), or other suitable transparent conducting oxide. The dielectric layer 30 may include a single layer or multiple layers of dielectric materials, such as silicon oxide, silicon nitride, aluminum oxide, an organic dielectric material (such as acrylic polymer material and/or siloxane polymer material), or other suitable dielectric materials. In addition, the organic light-emitting diode display device 101 may further include an isolation structure 50 and a cathode 60. The isolation structure 50 may be disposed between the light-emitting layers (such as the first light-emitting layer LE1, the second light-emitting layer LE2, and the third light-emitting layer LE3), and the cathode 60 may be disposed on the light-emitting layers and isolation structure 50. The cathode 60 may include a transparent electrically conductive material, such as transparent conducting oxide or other suitable transparent electrically conductive materials, and the isolation structure 50 may include an insulation material, such as a light-shielding insulation material having higher optical density (OD), but not limited thereto. In addition, each of the light-emitting layers described above may include an organic light-emitting structure with stacked material layers or other suitable light-emitting structures. For example, the organic light-emitting structure may include an electron injection layer, an electron transport layer, an organic electroluminescent material layer, a hole injection layer, and a hole transport layer (not illustrated), the electron injection layer and the electron transport layer may be disposed between the organic electroluminescent material layer and the cathode 60, and the hole injection layer and the hole transport layer may be disposed between the organic electroluminescent material layer and each anode (such as the first anode 40A, the second anode 40B, and the third anode 40C), but not limited thereto. The material compositions of the organic electroluminescent material layers in the first light-emitting layer LE1, the second light-emitting layer LE2, and the third light-emitting layer LE3 described above may be different from one another for emitting different colors of light.

In some embodiments, the reflective via structure connected with the corresponding anode may be not disposed directly below the corresponding light-emitting layer in the vertical direction D1 for avoiding the influence of the reflective via structure on the effect of light reflection. For example, in the vertical direction D1 and/or when the organic light-emitting diode display device 101 is viewed in the vertical direction D1, the first light-emitting layer LE1 does not overlap the first reflective via structure RV1, but not limited thereto. In some embodiments, the organic light-emitting diode display device 101 may further include a dielectric layer 20 and a plurality of electrically conductive via structures CV. The dielectric layer 20 is disposed between the device substrate MS and each of the reflective patterns (such as the first reflective pattern RP1, the second reflective pattern RP2, and the third reflective pattern RP3), and the electrically conductive via structures CV may be disposed in the dielectric layer 20. Each of the electrically conductive via structures CV may be electrically connected with the device substrate MS and the corresponding reflective pattern, and the device substrate MS may be electrically connected with the reflective patterns (such as the first reflective pattern RP1, the second reflective pattern RP2, and the third reflective pattern RP3) through the electrically conductive via structures CV accordingly. The dielectric layer 20 may include a single layer or multiple layers of dielectric materials, such as silicon oxide, silicon nitride, silicon oxynitride, or other suitable dielectric materials, and each of the electrically conductive via structures CV may include a barrier layer and a low resistivity material disposed on the barrier layer, the low resistivity material may include a material with relatively low electrical resistivity, such as copper, aluminum, tungsten, and so forth, and the barrier layer may include titanium nitride, tantalum nitride, or other suitable electrically conductive barrier materials, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
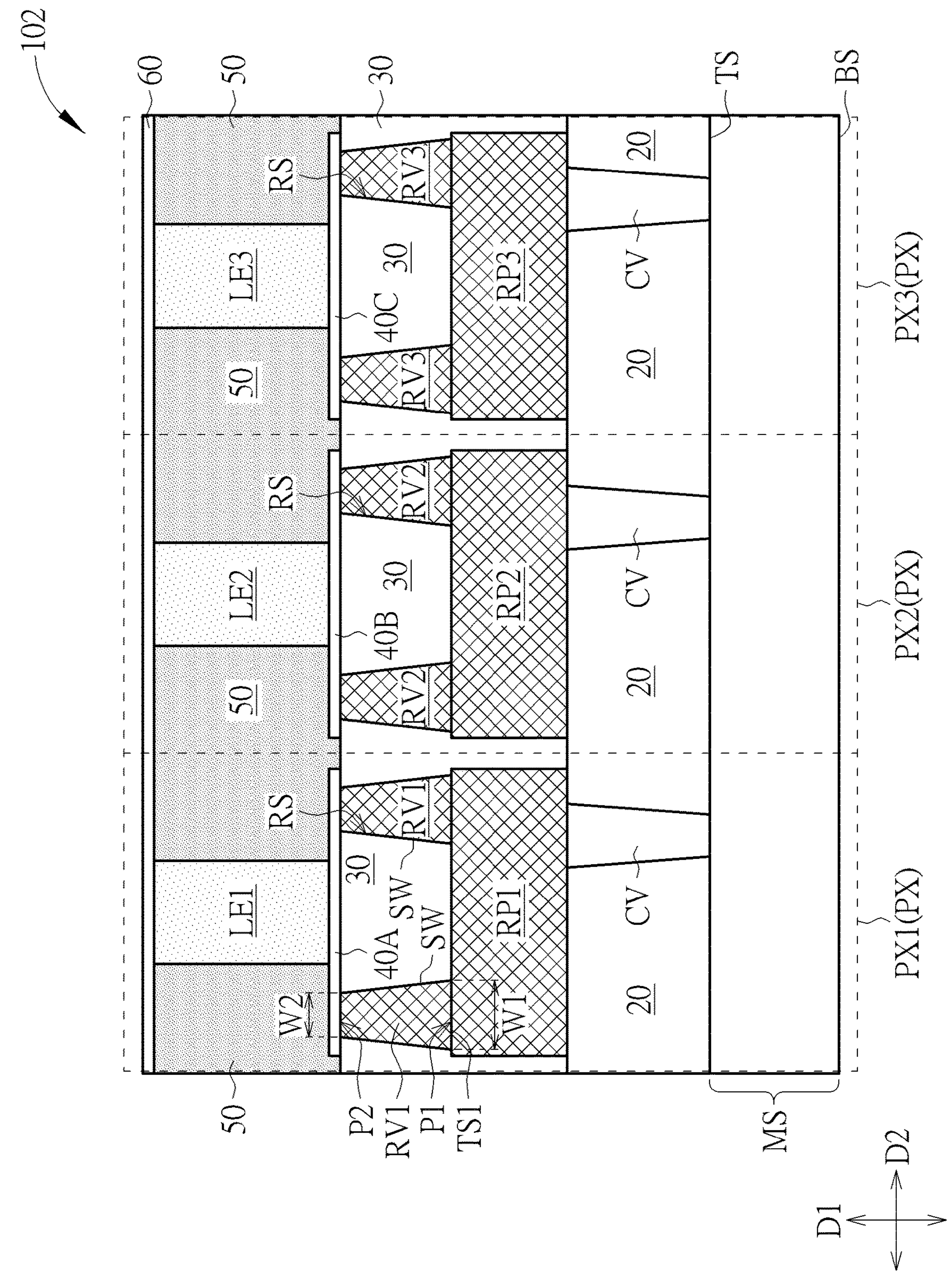
FIG. 2 is a schematic drawing illustrating an organic light-emitting diode display device according to a second embodiment of the present invention.
Figure 3:
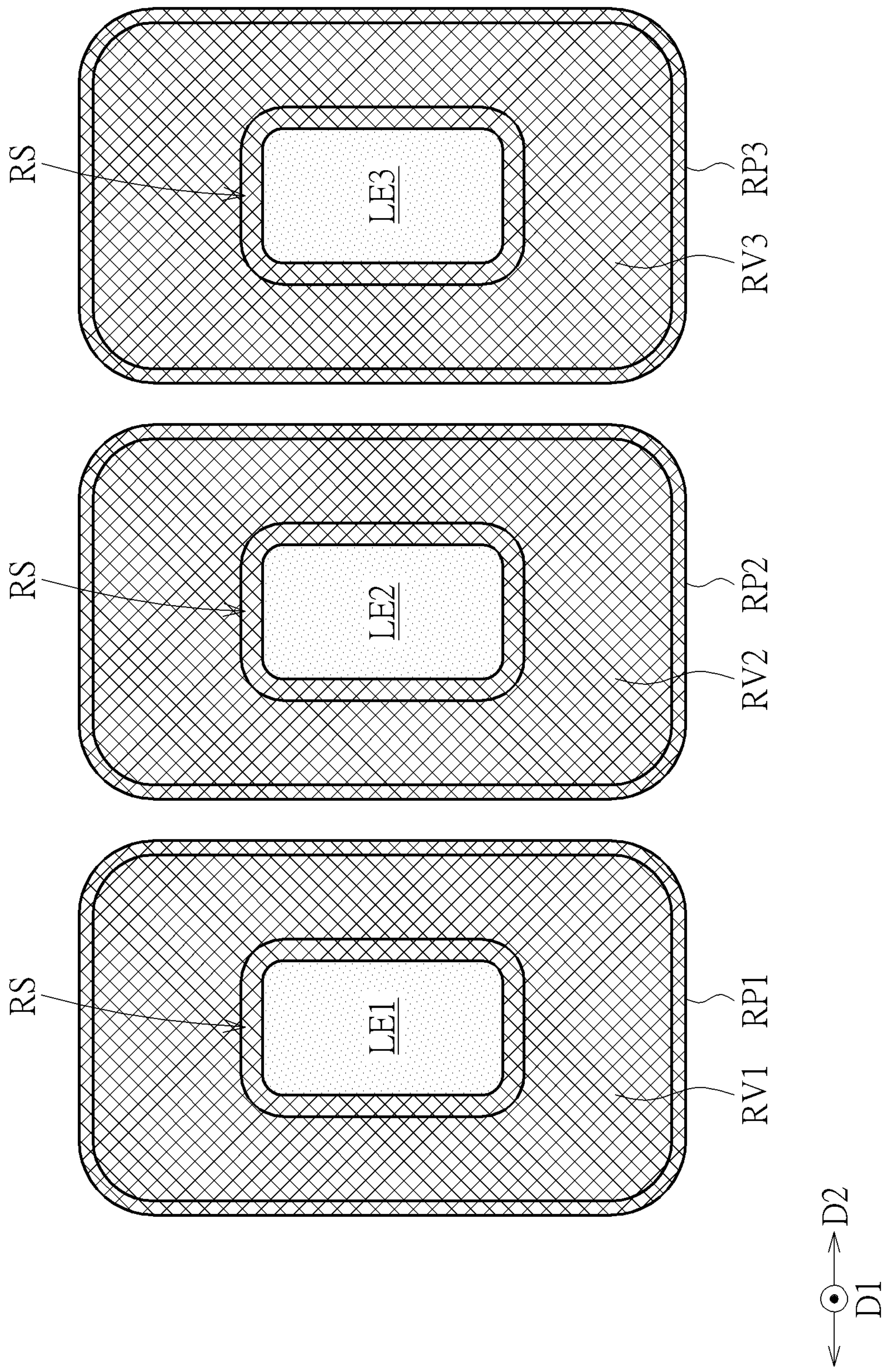
FIG. 3 is a top-view schematic drawing illustrating the organic light-emitting diode display device according to the second embodiment of the present invention.

Please refer to FIG. 2 and FIG. 3. FIG. 2 is a schematic drawing illustrating an organic light-emitting diode display device 102 according to a second embodiment of the present invention, FIG. 3 is a top-view schematic drawing illustrating the organic light-emitting diode display device in this embodiment, and FIG. 3 only shows the top-view arrangement of the light-emitting layers, the reflective patterns, and the reflective via structures in the organic light-emitting diode display device. As shown in FIG. 2 and FIG. 3, in the organic light-emitting diode display device 102, a top portion P2 of the first reflective via structure RV1 is connected with the first anode 40A, a bottom portion P1 of the first reflective via structure RV1 is connected with the first reflective pattern RP1, and a width W1 of the bottom portion P1 is greater than a width W2 of the top portion P2. In other words, a cross-sectional shape of the first reflective via structure RV1 may include a trapezoidal structure with narrow top and wide bottom, but not limited thereto. In some embodiments, the first reflective via structure RV1 may surround a part of the dielectric material 30 located between the first anode 40A and the first reflective pattern RP1 in the horizontal direction. In addition, a sidewall SW of the first reflective via structure RV1 and a top surface TSI of the first reflective pattern RP1 may constitute a recess structure RS, and a part of the dielectric material 30 may be disposed in the recess structure RS. In some embodiments, the sidewall SW of the first reflective via structure RV1 may be a flat surface, but not limited thereto. In addition, a projection area of the recess structure RS in the vertical direction D1 may be greater than a projection area of the first light-emitting layer LE1 in the vertical direction D1 for avoiding the influence of the first reflective via structure RV1 overlapping the first light-emitting layer LE1 on the effect of light reflection. In addition, the structure of the second reflective via structure RV2 disposed in the second sub-pixel region PX2 and the structure of the third reflective via structure RV3 disposed in the third sub-pixel region PX3 may be identical to the first reflective via structure RV1, the second reflective via structure RV2 and the second reflective pattern RP2 may constitute another recess structure RS, and the third reflective via structure RV3 and the third reflective pattern RP3 may constitute further another recess structure RS.

Figure 4:
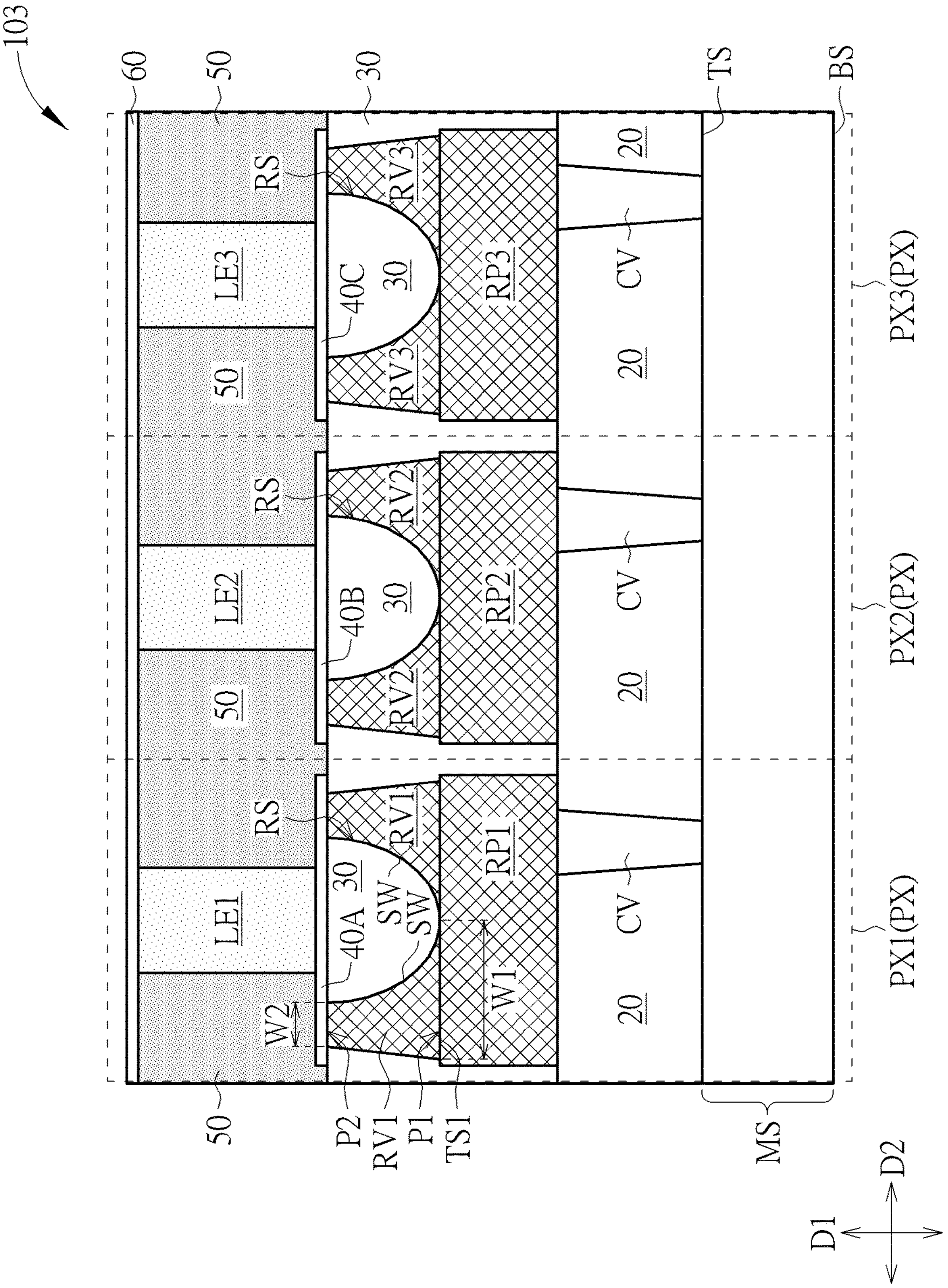
FIG. 4 is a schematic drawing illustrating an organic light-emitting diode display device according to a third embodiment of the present invention.

Please refer to FIG. 4. FIG. 4 is a schematic drawing illustrating an organic light-emitting diode display device 103 according to a third embodiment of the present invention. As shown in FIG. 4, in the organic light-emitting diode display device 103, the sidewall SW of the first reflective via structure RV1 may include a curved surface, the recess structure RS may be a concave mirror located under the first light-emitting layer LE1 in the vertical direction D1, and the display brightness may be enhanced and/or the focus position of the display light may be adjusted accordingly for meeting display requirements for specific products. In some embodiments, the reflective via structure having the curved inner sidewall may be formed by etching an electrically conductive metallic material layer in different etching approaches separately, but not limited thereto.

Figure 5:
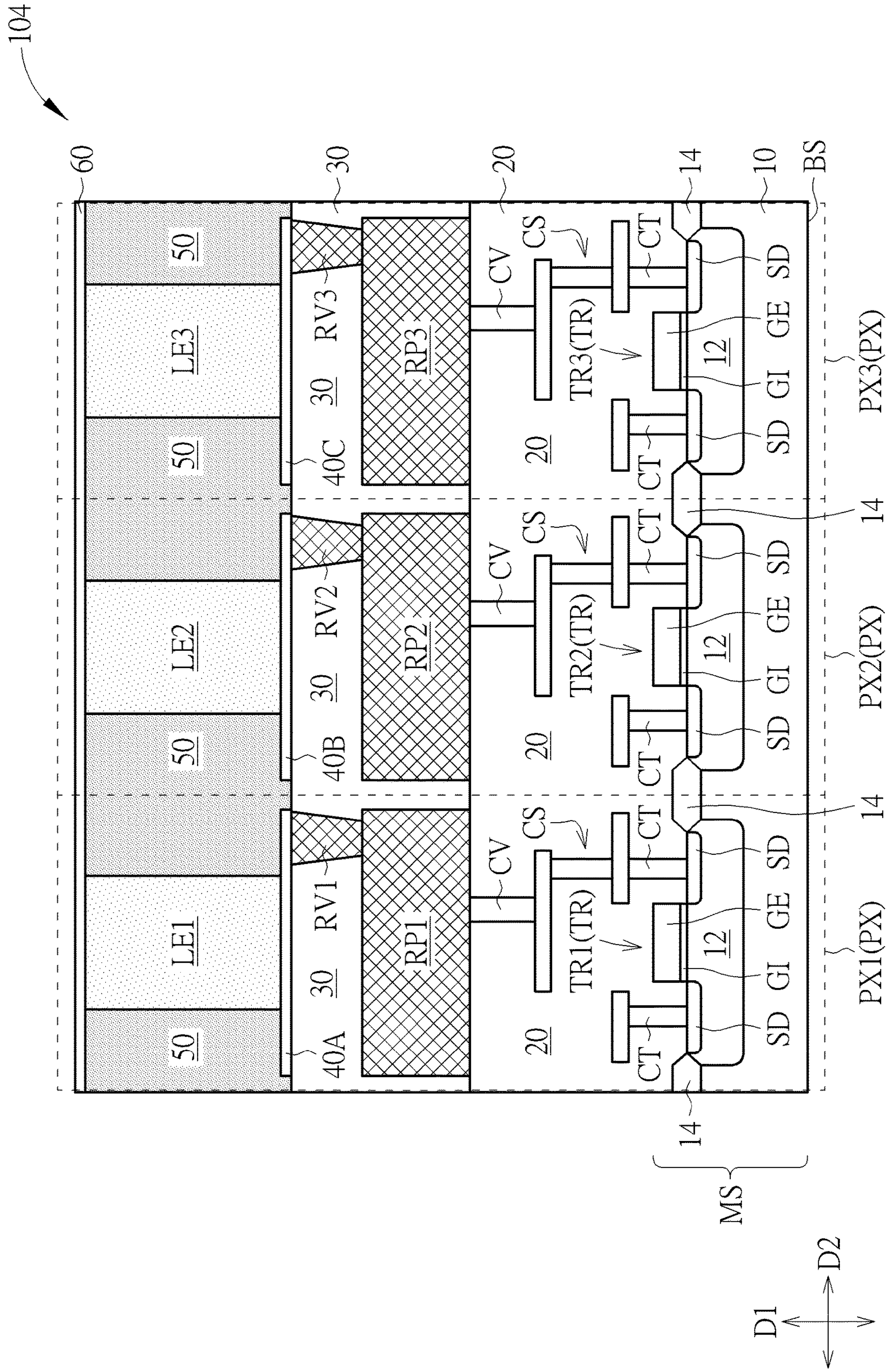
FIG. 5 is a schematic drawing illustrating an organic light-emitting diode display device according to a fourth embodiment of the present invention.

Please refer to FIG. 5. FIG. 5 is a schematic drawing illustrating an organic light-emitting diode display device 104 according to a fourth embodiment of the present invention. As shown in FIG. 5, in the organic light-emitting diode display device 104, the device substrate MS may include a semiconductor substrate 10 and a plurality of transistors TR (such as a transistor TR1 disposed in the first sub-pixel region PX1, a transistor TR2 disposed in the second sub-pixel region PX2, and a transistor TR3 disposed in the third sub-pixel region PX3), and the organic light-emitting diode display device 104 may further include a plurality of contact structures CT and a plurality of interconnection structures CS disposed in the dielectric layer 20. The semiconductor substrate 10 may include a silicon substrate, a silicon germanium substrate, a silicon-on-insulator (SOI) substrate, or a substrate made of other suitable semiconductor materials, and the organic light-emitting diode display device 104 may be regarded as an OLED on silicon (OLEDoS) display device accordingly, but not limited thereto. The transistor TR may be partly disposed in the semiconductor substrate 10, and the transistor TR may be electrically connected with the corresponding anode through the corresponding reflective pattern. For example, the transistor TR may include a gate dielectric layer GI, a gate electrode GE, a well region 12 and source/drain regions SD. The gate dielectric layer GI and the gate electrode GE are disposed on the semiconductor substrate 10, and the well region 12 and the source/drain regions SD are disposed in the semiconductor substrate 10. An isolation structure 14 may be at least partially disposed in the semiconductor substrate 10 for isolating the adjacent transistors TR. One of the transistors TR (such as the transistor TR1) may be electrically connected with the corresponding anode (such as the first anode 40A) through the contact structure CT, the interconnection structure CS, the electrically conductive via structure CV, the reflective pattern (such as the first reflective pattern RP1), and the reflective via structure (such as the first reflective via structure RV1). The contact structure CT and the interconnection structure CS may include a barrier layer and a low resistivity material disposed on the barrier layer, the low resistivity material may include a material with relatively low electrical resistivity, such as copper, aluminum, tungsten, and so forth, and the barrier layer may include titanium nitride, tantalum nitride, or other suitable electrically conductive barrier materials, but not limited thereto. In some embodiments, a material composition of each reflective pattern may be different from a material composition of the electrically conductive via structure CV, a material composition of the interconnection structure CS, and/or a material composition of the contact structure CT. For instance, the reflective pattern may be made of an electrically conductive metallic material with better light reflection effect, but not limited thereto. Additionally, it is worth noting that the device substrate MS in this embodiment may be applied to other embodiments of the present invention according to some design considerations.

To summarize the above descriptions, in the organic light-emitting diode display device according to the present invention, the reflective pattern is disposed under and electrically connected with the anode located in the sub-pixel region without being directly connected with the anode, the viewing angle range of the display device may be improved, the display light uniformity of the display device may be improved, and/or the display requirements of specific products may be met accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An organic light-emitting diode display device, comprising:

a first light-emitting layer located in a first sub-pixel region;

a first anode disposed under the first light-emitting layer in a vertical direction and located in the first sub-pixel region;

a first reflective pattern disposed under the first anode in the vertical direction and located in the first sub-pixel region;

a dielectric material partly disposed between the first anode and the first reflective pattern, wherein the first reflective pattern is electrically connected with the first anode; and a first reflective via structure disposed between the first anode and the first reflective pattern, wherein the first reflective pattern is electrically connected with the first anode through the first reflective via structure.

2. The organic light-emitting diode display device according to claim 1, wherein a material composition of the first reflective via structure is identical to a material composition of the first reflective pattern.

3. The organic light-emitting diode display device according to claim 1, wherein the first reflective via structure is directly connected with the first reflective pattern and the first anode.

4. The organic light-emitting diode display device according to claim 1, wherein a top portion of the first reflective via structure is connected with the first anode, a bottom portion of the first reflective via structure is connected with the first reflective pattern, and a width of the bottom portion is greater than a width of the top portion.

5. The organic light-emitting diode display device according to claim 1, wherein the first reflective via structure surrounds a part of the dielectric material located between the first anode and the first reflective pattern.

6. The organic light-emitting diode display device according to claim 1, wherein a sidewall of the first reflective via structure and a top surface of the first reflective pattern constitute a recess structure.

7. The organic light-emitting diode display device according to claim 6, wherein a projection area of the recess structure in the vertical direction is greater than a projection area of the first light-emitting layer in the vertical direction.

8. The organic light-emitting diode display device according to claim 6, wherein the recess structure is a concave mirror located under the first light-emitting layer in the vertical direction.

9. The organic light-emitting diode display device according to claim 1, wherein a sidewall of the first reflective via structure is a flat surface.

10. The organic light-emitting diode display device according to claim 1, wherein a sidewall of the first reflective via structure is a curved surface.

11. The organic light-emitting diode display device according to claim 1, wherein the first light-emitting layer does not overlap the first reflective via structure when the organic light-emitting diode display device is viewed in the vertical direction.

12. The organic light-emitting diode display device according to claim 1, wherein the first anode comprises a transparent electrically conductive material.

13. The organic light-emitting diode display device according to claim 1, wherein the first reflective pattern comprises an electrically conductive metallic material.

14. The organic light-emitting diode display device according to claim 1, further comprising:

a second light-emitting layer located in a second sub-pixel region;

a second anode disposed under the second light-emitting layer in the vertical direction and located in the second sub-pixel region;

a second reflective pattern disposed under the second anode in the vertical direction and located in the second sub-pixel region, wherein the dielectric material is further partly disposed between the second anode and the second reflective pattern; and a second reflective via structure disposed between the second anode and the second reflective pattern, wherein the second reflective pattern is electrically connected with the second anode through the second reflective via structure.

15. The organic light-emitting diode display device according to claim 14, wherein the second reflective pattern is physically and electrically separated from the first reflective pattern.

16. The organic light-emitting diode display device according to claim 14, further comprising:

a cathode disposed on the first light-emitting layer and the second light-emitting layer, wherein the first anode and the second anode are physically and electrically separated from each other.

17. The organic light-emitting diode display device according to claim 1, further comprising:

a device substrate, wherein the first reflective pattern, the first anode, and the first light-emitting layer are disposed on the device substrate, the first reflective pattern is located between the first anode and the device substrate, and the first reflective pattern is electrically connected with the device substrate.

18. The organic light-emitting diode display device according to claim 17, further comprising:

a dielectric layer disposed between the device substrate and the first reflective pattern; and an electrically conductive via structure disposed in the dielectric layer, wherein the electrically conductive via structure is electrically connecting with the first reflective pattern and the device substrate.

19. The organic light-emitting diode display device according to claim 17, wherein the device substrate comprises:

a semiconductor substrate; and transistors, wherein each of the transistors is partly disposed in the semiconductor substrate, and one of the transistors is electrically connected with the first anode through the first reflective pattern.

* * * * *